United States Patent
Chen et al.

(10) Patent No.: US 8,296,620 B2
(45) Date of Patent: Oct. 23, 2012

(54) DATA DEVICES INCLUDING MULTIPLE ERROR CORRECTION CODES AND METHODS OF UTILIZING

(75) Inventors: Yiran Chen, Eden Prairie, MN (US); Hai Li, Eden Prairie, MN (US); Hongyue Liu, Maple Grove, MN (US); Yong Lu, Rosemount, MN (US); Song S. Xue, Edina, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 976 days.

(21) Appl. No.: 12/198,516

(22) Filed: Aug. 26, 2008

(65) Prior Publication Data

US 2010/0058125 A1   Mar. 4, 2010

(51) Int. Cl.
*G06F 11/00* (2006.01)
(52) U.S. Cl. ........................ 714/758; 714/744
(58) Field of Classification Search ........... 714/758, 714/744
See application file for complete search history.

(56) References Cited

U.S. PATENT DOCUMENTS

| | | | |
|---|---|---|---|
| 5,996,109 A | 11/1999 | Shikakura | |
| 7,295,764 B2 | 11/2007 | Betti | |
| 7,340,665 B2 | 3/2008 | Tsang | |
| 2004/0237023 A1 | 11/2004 | Takahashi | |
| 2006/0236165 A1 | 10/2006 | Cepulis | |
| 2008/0072120 A1* | 3/2008 | Radke | 714/768 |
| 2008/0130986 A1 | 6/2008 | Bae | |

OTHER PUBLICATIONS

Furutani et al., A Built-In Hamming Code ECC Circuit for DRAM's, IEEE Journal of Solid-State Circuits, vol. 24, No. 1, Feb. 1989.

* cited by examiner

*Primary Examiner* — Bryce Bonzo
(74) *Attorney, Agent, or Firm* — Mueting Raasch & Gebhardt PA (57) ABSTRACT

A method of utilizing at least one block of data, wherein the at least one block of data includes a plurality of cells for storing data and at least one error flag bit, the method including: scanning the block of data for errors; determining the error rate of the block of data; and applying an error correction code to data being read from or written to a cell within the at least one block of data, wherein the error correction code is applied based on the error rate, wherein a weak error correction code is applied when the error rate is below an error threshold, and a strong error correction code is applied when the error rate is at or above the error threshold.

23 Claims, 6 Drawing Sheets

DATA DEVICES INCLUDING MULTIPLE ERROR CORRECTION CODES AND METHODS OF UTILIZING

BACKGROUND

Magnetic random access memory (MRAM) as well as other types of memory, can suffer corruption of data due to soft-errors, which are generally caused by random issues in operation. Such soft-errors may result in defects in MRAM cells and consequently cause erroneous operation. Some forms of MRAM include built in processes, such as error correcting codes (ECCs) to address such errors.

The maximum amount of errors that can be corrected by a process, such as an ECC, and the overhead (time, memory space and cost) of that ECC are generally a tradeoff. Therefore, there is always a need for further advancements in ECC usage.

BRIEF SUMMARY

Disclosed herein is a method of utilizing at least one block of data, wherein the at least one block of data includes a plurality of cells for storing data and at least one error flag bit, the method including: scanning the block of data for errors; determining the error rate of the block of data; and applying an error correction code to data being read from or written to a cell within the at least one block of data, wherein the error correction code is applied based on the error rate, wherein a weak error correction code is applied when the error rate is below an error threshold, and a strong error correction code is applied when the error rate is at or above the error threshold.

Disclosed herein is a method of checking and correcting data in at least one block of data, wherein the at least one block of data includes at least one cell for storing data and at least one error flag bit, the method including: detecting errors in the at least one block of data; determining a first error rate of the block of data; comparing the first error rate of the block of data to an error threshold rate; reading from or writing to the at least one block of data, wherein reading or writing includes utilizing an error correction code, wherein a weak error correction code is utilized when the first error rate of the block of data is below the error threshold rate, and a strong error correction code is applied when the first error rate of the block of data is at or above the error threshold rate; detecting errors in the at least one block of data after the data has been read from or written to the at least one cell within the at least one block of data; determining a second error rate of the block of data based on the detection of errors after the data has been read from or written to the at least one cell; comparing the second error rate of the block of data to the error threshold rate; and reading from or writing to the at least one block of data, wherein reading or writing includes utilizing an error correction code, wherein a weak error correction code is utilized when the second error rate of the block of data is below the error threshold rate, and a strong error correction code is applied when the second error rate of the block of data is at or above the error threshold rate.

Disclosed herein is a data device that includes at least one block of data that includes a plurality of cells for storing data and at least one error flag bit; a scanning component, wherein the scanning component is configured to scan the at least one block of data for errors and determine an error rate for the at least one block of data; a strong error correction code; a weak error correction code; and an error correction code router, wherein the error correction code router routes the at least one block of data to be encoded by either the strong error correction code or the weak error correction code based on the error rate determined by the scanning component.

BRIEF DESCRIPTION OF THE DRAWINGS

The disclosure may be more completely understood in consideration of the following detailed description of various embodiments of the disclosure in connection with the accompanying drawings, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

Methods as disclosed herein can offer advantages, especially when applied to data storage systems. Methods as disclosed herein can offer low overhead error correcting that can be used most of the time with the added ability to utilize high overhead error correcting when necessary. Such a combination can maintain low cost, efficient memory that can be maintained in a functional state (albeit at a higher cost) for longer. The combination can offer minimum performance degradation while still maintaining functional memory for a longer period of time.

Figure 1:
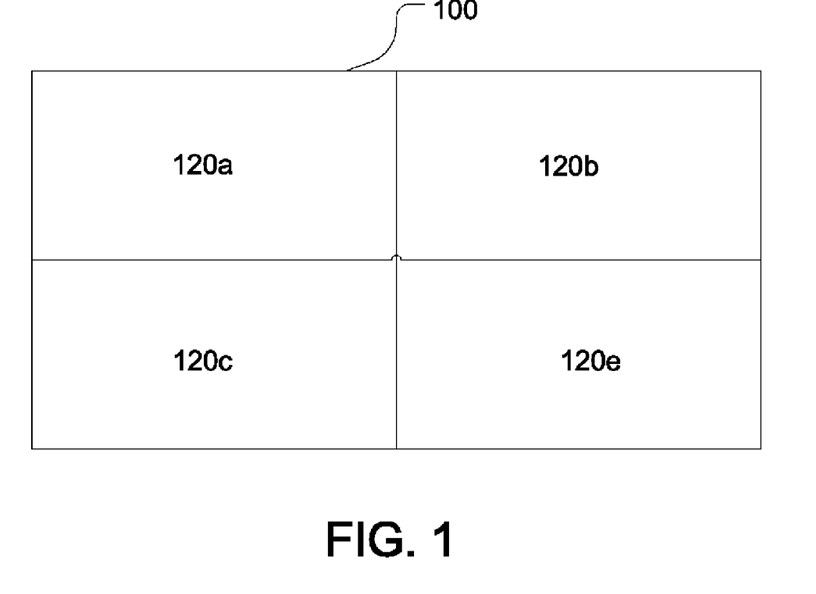
FIG. 1 is an exemplary embodiment of a block of data utilized in methods and devices as disclosed herein.

Disclosed herein are methods of utilizing at least one block of data. An exemplary block of data is illustrated in FIG. 1, as block 100. The at least one block of data can be a block of data contained in any communication channel, communication system or computer system. In an embodiment, the at least one block of data can be included in a communication channel (e.g. telephones, deep space telecommunications or satellite broadcasting), camera technology, the Internet, or data storage systems. The methods and devices disclosed herein are generally described in the context of a data storage system, but that should in no way be taken as limiting the scope of the present disclosure. Generally, a data storage system can include any system in which data is written to a storage medium and then read back from the storage medium. The storage medium can include, but is not necessarily limited to, hard discs, floppy discs, magnetic tapes, optical discs and integrated circuits for memory. Exemplary types of memory that can be utilized in the storage medium include, but are not limited to, both volatile and non-volatile memory.

Volatile memory includes any kind of computer memory that requires power to maintain the stored information. Most commonly utilized forms of volatile memory are random access memory (RAM). Exemplary types of RAM include, but are not limited to, dynamic RAM (DRAM), static RAM (SRAM), zero capacitor RAM (Z-RAM) and twin transistor RAM (TTRAM). The at least one block of data can generally be contained in volatile memory, for example.

Non-volatile memory includes any kind of computer memory that can retain information stored thereon when not powered. Any known types of non-volatile memory may be used as the non-volatile main memory. Examples of non-volatile memory that may be utilized as the non-volatile main memory include, but are not limited to, read only memory (ROM), flash memory, hard drives, and random access memory (RAM). Examples of ROM include, but are not limited to, programmable ROM (PROM) which can also be referred to as field programmable ROM; electrically erasable programmable ROM (EEPROM) which is also referred to as electrically alterable ROM (EAROM); and erasable programmable ROM (EPROM). Examples of RAM include, but are not limited to, ferroelectric RAM (FeRAM or FRAM); magnetoresistive RAM (MRAM); resistive RAM (RRAM); non-volatile static RAM (nvSRAM); battery backed static RAM (BBSRAM); phase change memory (PCM) which is also referred to as PRAM, PCRAM and C-RAM; programmable metallization cell (PMC) which is also referred to as conductive-bridging RAM or CBRAM; nano-RAM (NRAM), spin torque transfer RAM (STTRAM) which is also referred to as STRAM; and Silicon-Oxide-Nitride-Oxide-Silicon (SONOS), which is similar to flash RAM. Solid-state drives, which are similar in functioning to hard drives can also be utilized as non-volatile memory. The at least one block of data can generally be contained in non-volatile memory, for example. In an embodiment, the at least one block of data is contained in MRAM, RRAM, PCM, STTRAM or PMC.

The at least one block of data generally includes a plurality of cells that contain data. In an embodiment, a plurality of cells refers to more than one cell. In an embodiment, a plurality of cells refers to multiple cells. The exemplary embodiment of a block 100 depicted in FIG. 1 includes four cells, 120a, 120b, 120c, and 120e. In an embodiment where the at least one block of data is included in a data storage system, the at least one block of data can be contained in a block of memory that contains a plurality of memory cells. The number of cells within a block of data depends at least in part on the size of the block of data. In an embodiment, where the block of data is or is contained within a data storage system, the number of cells within the block of data is dependent on the size of the data storage system.

At least one of the plurality of cells within the block of data is configured to store a particular piece of data. In the embodiments depicted herein, this particular cell is generally given the designation e. Therefore, in the exemplary embodiment depicted in FIG. 1, the cell 120e is the cell that is configured to store a particular piece of data. It should be noted that there is no relevance to the location, size, or any other characteristic of cell 120e or any other cell designated in such a way. Generally, the cell that is configured to store a particular piece of data can be the same as any other cell in the data block. In an embodiment, the particular cell of the plurality of cells is configured to store an error flag bit. Error flag bits will be discussed in more detail below.

Figure 2:
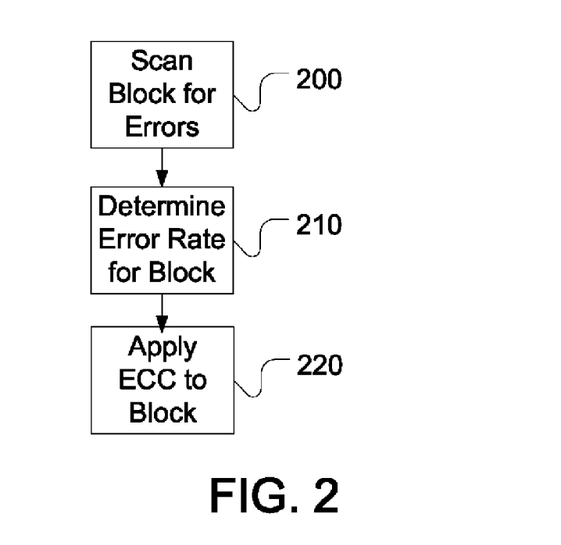
FIG. 2 is an exemplary embodiment of a method as disclosed herein.

An exemplary method disclosed herein is depicted in FIG. 2 and includes scanning at least one block for errors, represented by step 200; determining an error rate for the at least one block, represented by step 210; and applying an ECC to the at least one block, represented by step 220. Methods as disclosed herein can have steps that occur after the exemplary steps depicted in FIG. 2, can have steps that occur between one or more of the exemplary steps depicted in FIG. 2, or can have steps that occur in place of one or more of the exemplary steps depicted in FIG. 2. It should also be understood that steps in a method need not be carried out in the order in which they are depicted in a figure or discussed in the text, unless the steps can only be logically carried out in a particular order. Steps of methods disclosed herein can be carried out in orders other than those presented, can be carried out simultaneously, or both. One of skill in the art, having read this specification will also understand that two or more steps of a method disclosed herein can be carried out as one process; i.e., the steps need not be separated. Some, but not all, other embodiments of exemplary methods are depicted and described with respect to other figures presented herein.

A first step in an exemplary method as described herein includes scanning at least one block for errors. This exemplary step was represented in FIG. 2 as step 200. The step of scanning at least one block for errors can be carried out as would be known to one of skill in the art, having read this specification. One of skill in the art will also know, having read this specification, that the way in which the at least one block of data is scanned for errors can depend, at least in part, on the way in which detected errors may be corrected. Generally the following types of error detection methods (as well as others) can be utilized herein: repetition schemes, parity schemes, checksum schemes, cyclic redundancy checks, hamming distance based checks, hash functions, horizontal and vertical redundancy checks and polarity schemes. Exemplary ways in which the at least one block of errors can be scanned for errors includes, but is not limited to, using a built in self testing (BIST) block, using an external testing block, using both a BIST block and an external testing block, or using some other kind of scanning component. In an embodiment, a BIST block is utilized. One of skill in the art, having read this specification, will know how to utilize and implement the particular method of scanning that is utilized.

In an embodiment where the at least one block of data is a memory system, the plurality of cells making up the memory system can be scanned for errors. In an embodiment every cell within the block of memory can be scanned for errors and in another embodiment less than every cell within the block of memory can be scanned for errors. The timing of when the at least one block of data, for example the memory system, is scanned for errors can depend at least in part on a number of factors, including but not limited to, the type of memory system (or other kind of block of data), the error history, the relative amount of usage, or a combination thereof. Factors other than those described above can also be considered to determine when the at least one block of data can be scanned for errors. In an embodiment, the at least one block of data can be scanned periodically, constantly, substantially constantly, according to a schedule that can be modified, in response to a command, or a combination thereof.

One of skill in the art, having read this specification, will also understand that more than one block of data can be scanned for errors and/or have a method as disclosed herein carried out on the more than one block of data. In an embodiment, all blocks of data included in the particular system can be scanned for errors, and in another embodiment, less than all blocks of data included in the particular system can be scanned for errors.

Once the at least one block of data has been scanned for errors, an error rate for the at least one block of data can be determined. This step is depicted as step 210 in FIG. 2. Determining an error rate for the at least one block can be based on scanning every cell of the block of data or scanning less than every cell in the block of data. In an embodiment where less than every cell within the block of data was scanned for errors, some method of extrapolating the error rate of the scanned cells to the error rate of the entire block can be, but need not be, utilized. One of skill in the art, having read this specification, would understand and be aware of various methods that could be utilized to extrapolate such information.

The determined error rate can be presented as the number of cells containing errors; the number of cells containing errors relative to the number of cells scanned for errors; the number of cells containing errors relative to the number of cells in the block of data (either based on scanning all cells or an extrapolation); a percentage of cells containing errors (either based on scanning some of the cells, all cells or an extrapolation); or some other similar metric.

Once the error rate of the at least one block has been determined, an ECC is then applied to the at least one block. This step is depicted as step 220 in FIG. 2. Generally, the ECC is applied to the block of data in the context of a read or a write operation. Generally, one of at least two ECCs is applied to correct the errors detected in the at least one block. More particularly, either a strong ECC or a weak ECC can be applied to the at least one block of data to correct the errors within the block. Although this disclosure is described within the context of ECCs, it will be understood by one of skill in the art, having read this specification, that such ECCs can be used in conjunction with one or more additional codes or coding and decoding techniques.

ECCs generally function to allow data that is being read or transmitted that contains errors to be corrected. A general description of how it works in the context of data storage will be described. When data is stored in a memory system, a code that describes the bit sequence of the data is calculated (based on an algorithm) and stored along with the data. Generally, for each 64 bits of data, an extra 7 bits are needed to store this code. When the data is requested for reading, a code for the stored and "to be read" data is again calculated using the original algorithm. The newly generated code is compared with the code that was calculated when the data was stored. If the codes match, the data is free of errors and can be sent. If the codes don't match, the data contains at least one error. One of skill in the art, having read this specification, will understand that this process of an ECC can be used to scan the block of data for errors, as discussed above. Because the same algorithm can be used to both detect and correct errors, the steps of scanning for errors and correcting errors can be related. The missing or erroneous bits are then determined through the code comparison and missing bits are supplied or the erroneous bits are corrected.

Several schemes exist to achieve error correction, and any known error correction schemes known to one of skill in the art can be utilized herein. Generally, all error detection and correction codes transmit at least one more bit than was present in the original data. Most codes are referred to as systematic codes, in that a fixed number of the original data bits are sent, followed by a fixed number of check bits, which are derived from the original data bits by an algorithm. Generally, any known types of systematic (or non-systematic) error correction schemes can be utilized herein. It will also be understood, by one of skill in the art having read this specification that the method of scanning for errors may be chosen based at least in part on the method of correcting the errors once found.

Exemplary types of error correction schemes that can be utilized include, but are not limited to, automatic repeat request or forward error correction. Specific examples of forward error correction codes that can be utilized include, but are not limited to, Hamming codes, BCH codes, Reed-Solomon codes, Reed-Muller codes, Golay codes (such as Binary Golay codes), low density parity-check codes, Berger codes, constant-weight codes, convolutional codes, space-time codes (such as differential space-time codes and space-time trellis codes), fountain codes (such as erasure codes, raptor codes or tornado codes), group codes, Goppa codes, Hadamard codes, Hagelbarger codes, Lexicographic codes, LT codes, m of n codes, repeat-accumulate codes, sparse graph codes, turbo codes and walsh codes. In an embodiment, Hamming codes, BCH codes or both can be utilized.

The strength of an ECC is an indication of how many errors in a block the ECC can correct.

A stronger ECC can correct more errors in a block than can a weaker ECC. The strength of an ECC is generally proportional to the overhead (time of access and memory cost for example) introduced by the code. Generally, a strong code will introduce more overhead than a weak code. Prior art memory systems (or other data systems) often compromise between the strength of the ECC contained therewith and the overhead introduced by that ECC. Memory systems (or other data systems) as disclosed herein do not have to make that compromise because they contain both a strong and a weak ECC, which are used in appropriate conditions.

Generally, a strong ECC is one that can correct more errors than the weak ECC included in the data storage system; and a weak ECC is one that can correct less errors than the strong ECC included in the data storage system. In an embodiment, a strong ECC is one that can correct at least about 4 errors per 4 Kbytes. In an embodiment, a strong ECC is one that can correct at least about 4 errors per 2 Kbytes. In an embodiment, a strong ECC is one that can correct at least about 4 errors per 512 bytes. In an embodiment, a weak ECC is one that can correct less than or equal to about 1 error per 512 bytes. In an embodiment, a weak ECC is one that can correct less than or equal to about 1 error per 2 Kbytes. In an embodiment, a weak ECC is one that can correct less than or equal to about 1 error per 4 Kbytes.

Memory systems as disclosed herein include both a strong ECC and a weak ECC. In an embodiment, the strong ECC and the weak ECC are different codes (for example, two different Reed-Solomon codes). In an embodiment, the strong ECC and the weak ECC are different kinds of codes (for example, one is a Reed-Solomon code and one is a Hamming code).

Figure 3:
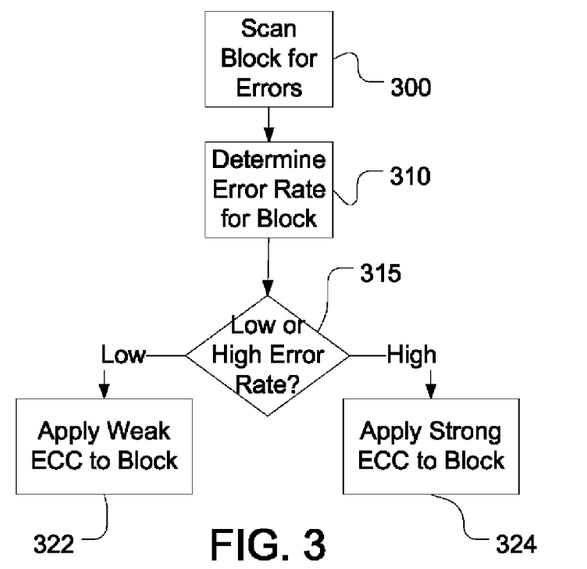
FIG. 3 is an exemplary embodiment of a method as disclosed herein.

FIG. 3 illustrates another exemplary embodiment of a method as disclosed herein. As seen in FIG. 3, the block of data is scanned for errors, 300; an error rate is determined for the block of data, 310; and the determined error rate is decided to be either high or low 315. Then, depending on whether the determined error rate is high or low, a weak ECC is applied if it is a low error rate, 322; or a strong ECC is applied if it is a high error rate, 324. One of skill in the art, having read this specification, would be aware of systems and processes for applying a strong ECC and a weak ECC to the block of data.

Whether the error rate of the block is high or low is based on how it relates to an error threshold. An error threshold is a rate of errors within a block that dictates whether the strong ECC or the weak ECC should be applied to the block of data. To state this another way, the error threshold differentiates between a block of data that has a high rate of errors and a block of data that has a low rate of errors. In an embodiment, a strong ECC can be applied to data where the rate of errors is above an error threshold and a weak ECC can be applied to data where the rate of errors is at or below the error threshold. In an embodiment, a strong ECC can be applied to data where the rate of error is at or above an error threshold and a weak ECC can be applied to data where the rate of errors is below the error threshold.

The particular value of an error threshold in a given method or device will depend at least in part on the type of system (e.g. memory or telecommunications), the operation time of the system, the environment in which the system is located, the acceptability of errors in the system or the application, and a combination thereof. Other factors can also be considered to determine the particular value of the error threshold. In an embodiment where the block of data is contained within a memory system, the particular value of the error threshold can depend at least in part on the particular type of memory being utilized, the particular function of the memory in the larger system (cache versus hard drive for example), the desired cost and efficiency of the particular memory component and the larger system, the acceptability of errors in the particular component or larger system, and a combination thereof. Factors other than those exemplified herein can also be considered in determining the particular value of the error threshold.

In an embodiment where the block of data is contained in a memory system, the error threshold is set between about 1 error per 4 Kbytes and 4 errors per 4 Kbytes. In an embodiment where the block of data is contained in a memory system, the error threshold is set between about 1 error per 2 Kbytes and 4 errors per 2 Kbytes. In an embodiment where the block of data is contained in a memory system, the error threshold is set between about 1 error per 512 bytes and 4 errors per 512 bytes.

An exemplary embodiment of a method disclosed herein includes a method of utilizing at least one block of data, wherein the at least one block of data includes a plurality of cells for storing data and at least one error flag bit, the method includes scanning the block of data for errors; determining the error rate of the block of data; and applying an error correction code to data being read from or written to a cell within the at least one block of data, wherein the error correction code is applied based on the error rate, wherein a weak error correction code is applied when the error rate is below an error threshold, and a strong error correction code is applied when the error rate is at or above the error threshold.

Figure 4A:
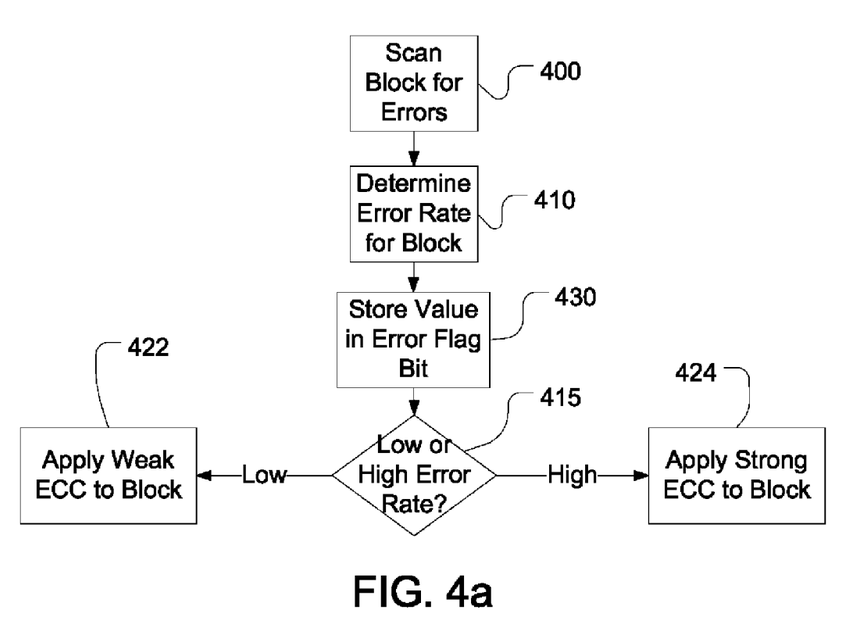
FIGS. 4a and 4b are exemplary embodiments of a method as disclosed herein.
Figure 4B:
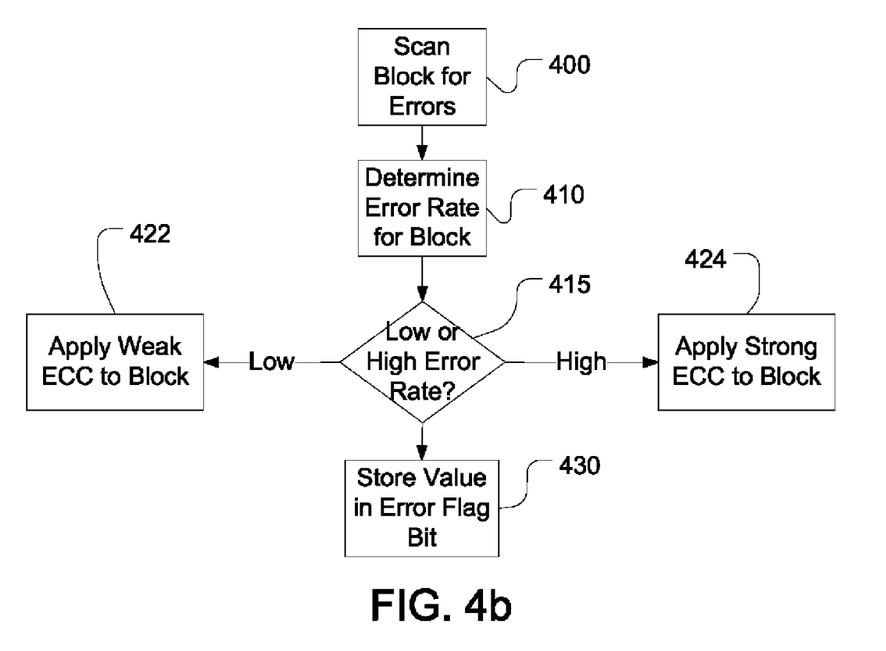

FIGS. 4a and 4b illustrate other exemplary embodiments of a method as disclosed herein. The methods illustrated in these figures add optional step 430. Optional step 430 includes storing a value in an error flag bit. As discussed above, an error flag bit can be contained within the block of data and can generally be contained in one (or more) of the plurality of cells making up the block of data. One of skill in the art, having read this specification, would be aware of systems and processes for storing such a value in the error flag bit. The value stored in the error flag bit generally relates to the rate of errors in the block of data. In an embodiment, the value stored in the error flag bit can, but need not, relate to the error threshold as well. In an embodiment, the value that is stored in the error flag bit is indicative of the application of the strong ECC or the weak ECC.

In an embodiment, a value that is stored in the error flag bit is generally indicative of the relative relationship of the error rate in that particular block of data (in which the error flag bit is contained or associated with) to the error threshold. For example, a 0 could be stored in the error flag bit if the rate of errors in the block of data is less than or equal to the error threshold and a 1 could be stored in the error flag bit if the rate of errors in the block of data is greater than the error threshold. Similarly, a 0 could be stored in the error flag bit if the rate of errors in the block of data is less than the error threshold and a 1 could be stored in the error flag bit if the rate of errors in the block of data is equal to or greater than the error threshold. Conversely, a 1 could be stored in the error flag bit if the rate of errors in the block of data is less than or equal to the error threshold and a 0 could be stored in the error flag bit if the rate of errors in the block of data is greater than the error threshold; or similarly, a 1 could be stored in the error flag bit if the rate of errors in the block of data is less than the error threshold and a 0 could be stored in the error flag bit if the rate of errors in the block of data is equal to or greater than the error threshold.

The exemplary method depicted in FIG. 4a illustrates a method in which the value is stored in the error flag bit, 430, before the weak or strong ECC is applied to the data block, 422 or 424 respectively. One of skill in the art will also understand, as exemplified in FIG. 4b, that the step of storing the value in the error flag bit, 430, can also take place after the weak or strong ECC is applied to the data block, 422 or 424 respectively. One of skill in the art will also understand that the steps 430 and 424 or 424 can also be carried out substantially simultaneously. Whether a step is depicted before, after, or simultaneous with another step does not automatically imply any such order, unless logic dictates an order based on the particular steps involved.

Figure 5:
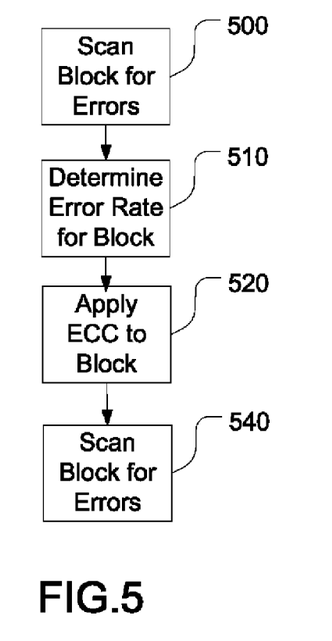
FIG. 5 is an exemplary embodiment of a method as disclosed herein.

Another exemplary method is depicted in FIG. 5. The method depicted in FIG. 5 depicts the steps discussed above: scanning the block for errors, 500; determining the error rate for the block, 510; and applying an ECC (weak or strong) to the block 520. The exemplary method in FIG. 5 also illustrates the optional step of scanning the block for errors at least a second time, 540. The block can be scanned for errors a second time anytime after the block is scanned the first time. In an embodiment, the block can be scanned a second time after the ECC (strong or weak) is applied to the block. The purpose of scanning the block for errors at least a second time is that errors could have occurred after the block was scanned the first time. For example, a random error could have occurred within the block after the block was scanned for errors the first time, an interim action on the block (for example a read command or a write command) could have caused an error in the block, or a combination thereof. In an embodiment where the first scan for errors was instigated because of a read command or a write command from or to the block of data, the act of writing to or reading from the block of data could have caused an error within the block.

The timing of a subsequent scan for errors (for example 540) can depend, at least in part, on the same factors that were considered to determine when the first scan should take place: the type of memory system (or other kind of block of data), the error history, the relative amount of usage, or a combination thereof. Factors other than those described above can also be considered to determine when the at least one block of data can be scanned for errors a second (or subsequent) time. In an embodiment, the at least one block of data can be scanned periodically, constantly, substantially constantly, according to a schedule that can be modified, in response to a command, or a combination thereof. In an embodiment, the time at which the block of data is scanned again can be based on the number of read cycles, write cycles, or both for the block of data; the number of operation cycles of the block of data; the number of operation cycles of an array containing the block of data; or some combination thereof.

In an embodiment, the at least one block of data can be read from or written to at least once before the block of data can be scanned for errors a second (or subsequent) time. In an embodiment, subsequent (second and so on) scans for errors can take place based on the number of read cycles, write cycles, or both for the block of data; the number of operation cycles of the block of data; the number of operation cycles of an array containing the block of data; or some combination thereof. In an embodiment, the second (or subsequent) scan for errors the second detection occurs after a scan delay time, wherein the scan delay time is a predetermined time between scans based on the type of memory.

An exemplary method as disclosed herein includes a method of checking and correcting data in at least one block of data, wherein the at least one block of data includes at least one cell for storing data and at least one error flag bit, the method including: detecting errors in the at least one block of data; determining a first error rate of the block of data; comparing the first error rate of the block of data to an error threshold rate; reading from or writing to the at least one block of data, wherein reading or writing includes utilizing an error correction code, wherein a weak error correction code is utilized when the first error rate of the block of data is below the error threshold rate, and a strong error correction code is applied when the first error rate of the block of data is at or above the error threshold rate; detecting errors in the at least one block of data after the data has been read from or written to the at least one cell within the at least one block of data; determining a second error rate of the block of data based on the detection of errors after the data has been read from or written to the at least one cell; comparing the second error rate of the block of data to the error threshold rate; and reading from or writing to the at least one block of data, wherein reading or writing includes utilizing an error correction code, wherein a weak error correction code is utilized when the second error rate of the block of data is below the error threshold rate, and a strong error correction code is applied when the second error rate of the block of data is at or above the error threshold rate.

Figure 6A:
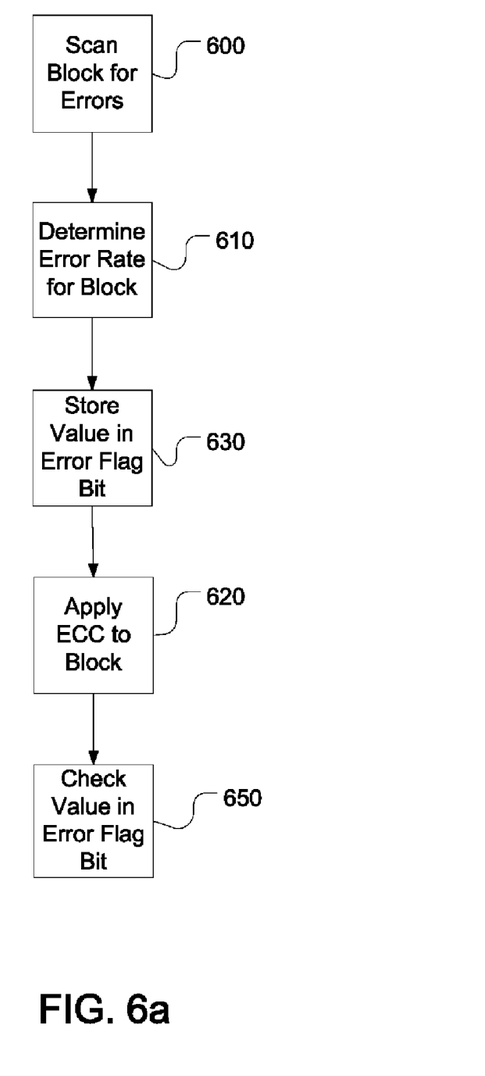
FIGS. 6a and 6b are exemplary embodiments of a method as disclosed herein.

Another exemplary method is depicted in FIG. 6a. The method depicted in FIG. 6a illustrates the steps discussed above: scanning the block for errors, 600; determining the error rate for the block, 610; storing a value in an error flag bit 630 and applying an ECC (weak or strong) to the block 620. The exemplary method in FIG. 6a also illustrates the optional step of checking the value in the error flag bit, 650. One of skill in the art would be able to utilize known systems and processes for checking the value in the error flag bit.

By checking the value in the error flag bit, such an exemplary method can utilize the relationship of the error rate of the block to the error threshold to determine if the weak or strong ECC should be applied going forward without further scanning for errors. Such a method can save time and/or resources by only scanning the block of data for errors once and then interacting with the block of data going forward based on that one time detection of the error rate.

Figure 6B:
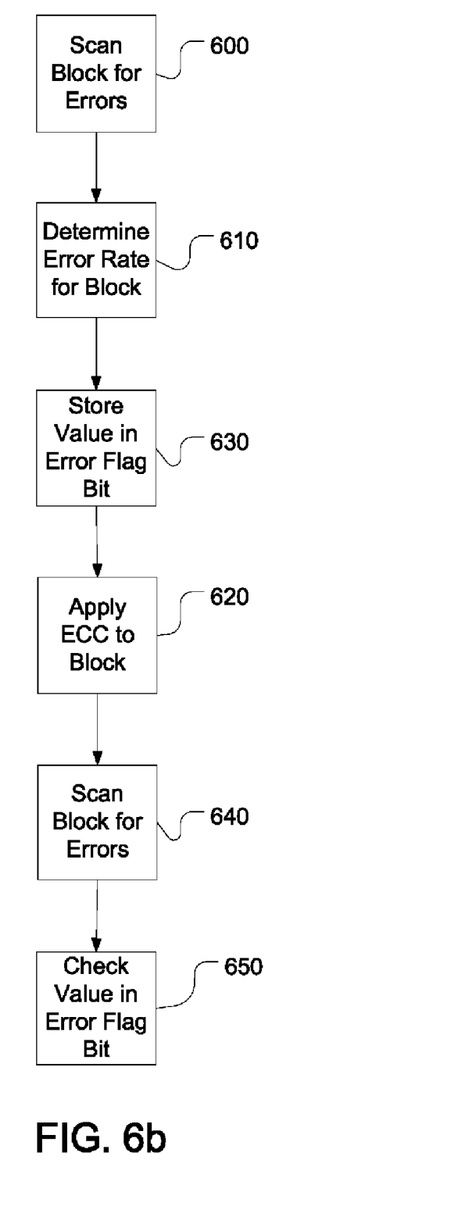

Another exemplary method is depicted in FIG. 6b. The method depicted in FIG. 6b illustrates the steps discussed above: scanning the block for errors, 600; determining the error rate for the block, 610; storing a value in an error flag bit 630, applying an ECC (weak or strong) to the block 620, scanning the block for errors a second time 640 and checking the value in the error flag bit 650. It should also be noted that the step of scanning the block for errors a second time, 640, can be carried out before or after the value in the error flag bit is checked. For example, the method depicted in FIG. 6a can be carried out and at a pre-determined overall time, a pre-determined operation time, or some combination thereof, the block of data can be scanned for errors a second time.

In an embodiment, a value that is stored in the error flag bit can be checked against a value that would be placed there given a subsequent scan for errors. Once the value in the error flag bit has been checked, the value in the error flag bit can be corrected if necessary. Such a correction is necessary if the most recent error rate is different than indicated by the value in the error flag bit. In an embodiment, the value written to the error flag bit can be compared to the value that would be written to the error flag bit based on the second error rate, wherein the first value would be written if the second error rate is below the error threshold and the second value would be written if the second error rate is at or above the error threshold. Furthermore, one such embodiment also includes writing the value to the error flag bit based on the second error rate if it is different from the value currently in the error flag bit.

Such an exemplary method can save time and/or resources by not scanning the block of data for errors every time the block of data is to be affected (either read from or written to for example). Exemplary methods that could take advantage of this efficient use of resources could scan the block of data at pre-determined time lapses, pre-determined numbers of operations, or a combination of both. Other exemplary methods could change the time lapse or number of operations before a second (or subsequent) scan as the error rate gets closer to the error threshold, or as more or different operations are being undertaken on the block of data.

Checking the value in the error flag bit can alert a user to a change from the weak ECC to the strong ECC (or vice versa) for example. Checking the value of the error flag bit over time, instead of just writing over it for example, can also allow the health of the memory to be monitored over time. Such monitoring could allow warnings to be sent to a user or different portions of memory to be utilized in place of failing memory.

Figure 7:
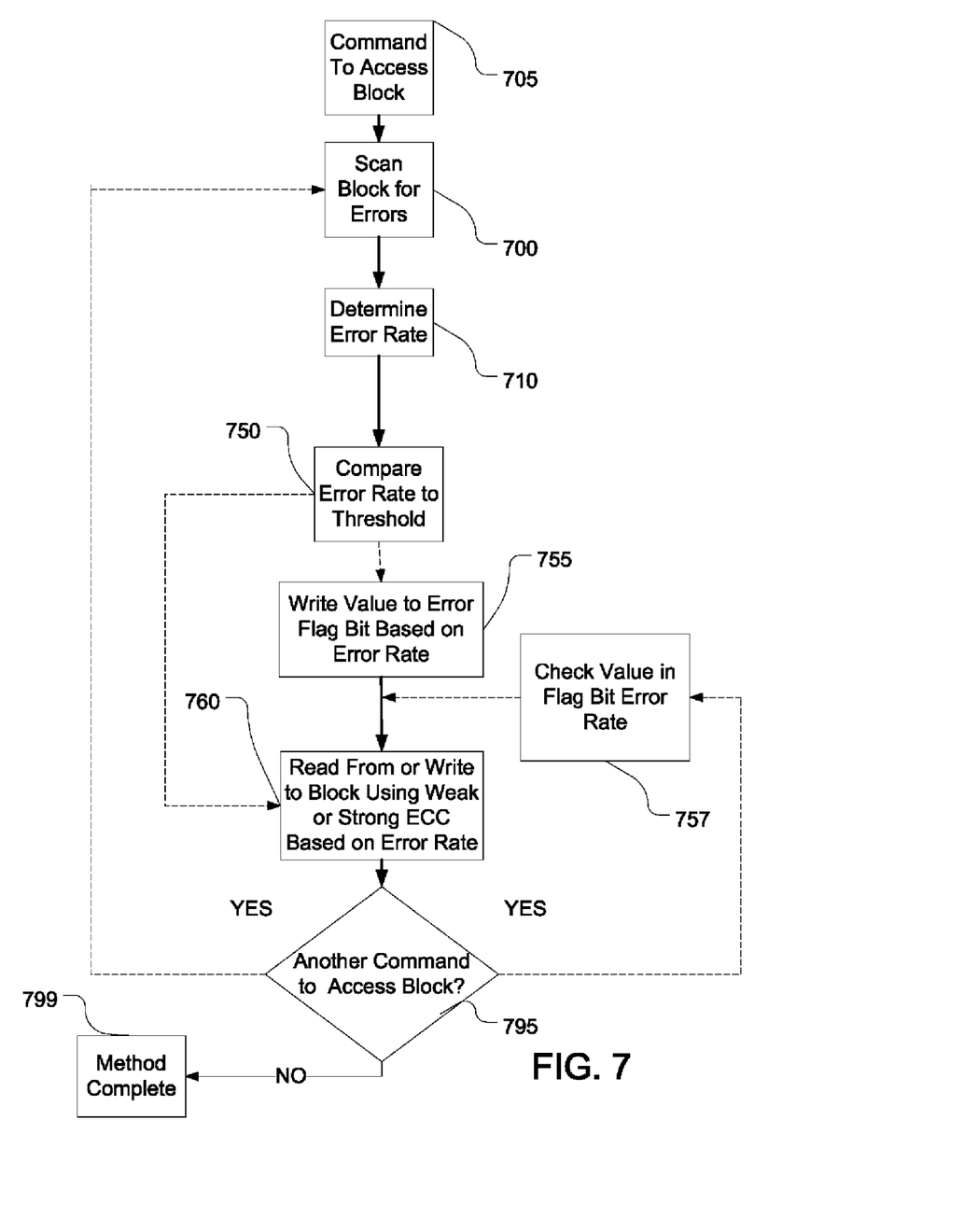
FIG. 7 is an exemplary embodiment of a method as disclosed herein.

Methods as disclosed herein may also be carried out in a substantially continual fashion. FIG. 7 illustrates an exemplary continuous method as disclosed herein. As seen in FIG. 7, the exemplary method can be (but need not be) instigated by a command to access the block, 705. In an embodiment where the block of data is part of a memory system, the command to access the block can be a read command or a write command for example. Once the command is received, the block can be scanned for errors, 700, to determine a first error rate, 710. The first error rate can then be compared to the error threshold 750 and the block can be read from or written to using the weak or the strong ECC based on the first error rate, 760. A value can also optionally be stored in the error flag bit 755 based on the error rate scanned (step 700) and determined (step 710).

After the step of acting on the block 760 (by reading or writing), another command to access the block is either received or not 795. A command not being received could occur when the system is shut down for example. A command not being received ends the method as exemplified by step 799. Once another access command is received, two different alternative paths can be taken.

One alternative path includes checking the value in the error flag bit 757 and reading from or writing to the block using a weak or strong ECC based on the value in the error flag bit 760. This alternative can be considered a tradeoff between the advantages of saving time, power, resources, or some combination thereof and the disadvantages of acting on the block based on an error rate that could be "stale".

A second alternative path includes scanning the block for errors again, 700 to determine an error rate 710. This error rate can then be compared to the error threshold 750 and the block can be acted upon based on that error rate 760 or the block can be acted upon based on that error rate 760 and a new (or a first) value can be stored in the error flag bit 755. One of skill in the art will understand that any possible combinations of the alternative pathways exemplified by FIG. 7 as well as alternative steps not illustrated by FIG. 7 can be combined in various combinations.

Figure 8A:
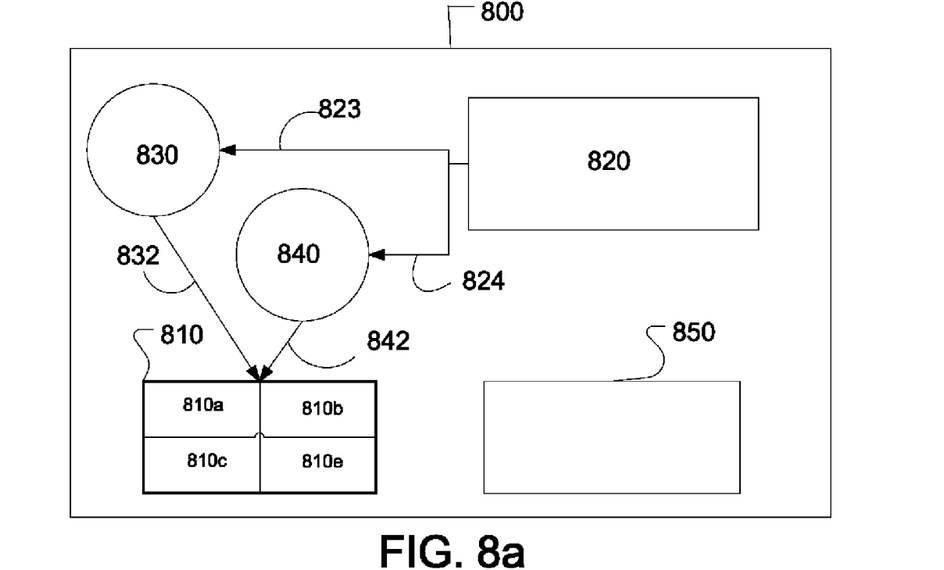
FIGS. 8a and 8b are exemplary embodiments of data devices as disclosed herein.

Also disclosed herein are devices. An exemplary embodiment of such a data device is depicted in FIG. 8a. In an embodiment, a data device 800 as disclosed herein includes at least one block of data 810 that includes a plurality of cells 810a, 810b, 810c and 810e. One of the plurality of cells can be configured as an error flag bit, for example 810e. The block of data can be contained in any communication channel or system. In an embodiment, the at least one block of data can be included in a communication channel (e.g. telephones, deep space telecommunications or satellite broadcasting), camera technology, the Internet, or a data storage system. Exemplary data storage systems can include, but are not limited to, hard discs, floppy discs, magnetic tapes, optical discs and integrated circuits for memory. Exemplary types of memory that can be utilized in the storage medium include, but are not limited to, both volatile and non-volatile memory as discussed above. One of skill in the art would know, having read this specification, the particular kinds of data blocks that can be used and how to configure the various kinds of data blocks to function within data devices as exemplified herein.

Exemplary data devices as described herein also include a scanning component 850. The scanning component 850 is generally configured to scan the at least one block of data for errors and determine an error rate for the at least one block of data The scanning component can generally take the form of a built in self testing (BIST) block or an external testing block. In an embodiment, the scanning component is a BIST block. One of skill in the art would know, having read this specification, the particular kinds of scanning components that can be used and how to configure the various kinds of scanning components to function within data devices as exemplified herein. In an embodiment, the scanning component 850 can be permanently or temporarily configured to communicate with the data block 810.

Exemplary devices as described herein also include a strong ECC, 830 and a weak ECC, 840. The strong ECC and weak ECC can generally include different kinds of codes as discussed above. The scanning component 850, the strong ECC 830 and the weak ECC 840 can, but need not, be parts or portions of a single code or block. Alternatively, the scanning component 850, the strong ECC 830 and the weak ECC 840 can be parts or portions of multiple codes or blocks. For example, a particular kind of ECC will often have a particular way of checking for errors, such associative portions of the data device can be utilized or can be interchanged.

Exemplary devices as described herein also include an error correction code router 820. The error correction code router 820 generally functions to route the at least one block of data to be encoded by either the strong error correction code or the weak error correction code based on the error rate determined by the scanning component. The error correction code router 820 functions to have the at least one block of data be acted upon by either the strong error correction code 830 via the strong route 823 and 832; or the weak error correction code 840 via the weak route 824 and 842. The error correction code router 820 can include components and carry out processes as would be known to one of skill in the art, having read this specification. In an embodiment, the error correction code router 820 can be a multiplexer or another type of permanent routing.

Figure 8B:
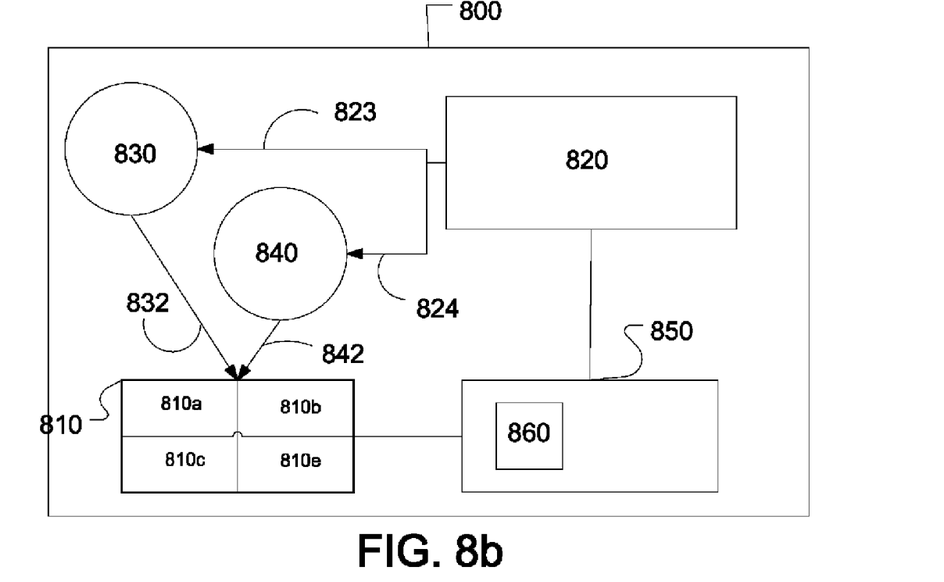

FIG. 8b illustrates another exemplary embodiment of a data device as described herein. This exemplary data device 800 includes the components above with respect to FIG. 8a and additionally includes a writing component 860. The writing component 860 generally functions to write a value to the error flag bit 810e that is indicative of the relationship of the error rate to the error threshold. The writing component 860 can generally include components and carry out processes as would be known to one of skill in the art, having read this specification.

Thus, embodiments of data devices including multiple error correction codes and methods of utilizing them are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation.

What is claimed is:

1. A method of utilizing at least one block of data, wherein the at least one block of data comprises a plurality of cells for storing data and at least one error flag bit, the method comprising:
scanning the block of data for errors;
determining an error rate of the block of data; and
applying an error correction code to data being read from or written to a cell within the at least one block of data, wherein the error correction code is applied based on the error rate, wherein a weak error correction code is applied when the error rate is below an error threshold, and a strong error correction code is applied when the error rate is at or above the error threshold, wherein the weak error correction code is a different type of error correction code than the strong error correction code.

2. The method according to claim 1 further comprising storing a value in the error flag bit, wherein the value is indicative of the application of the strong error correction code or the weak error correction code.

3. The method according to claim 1 further comprising scanning the at least one block of data for errors at least one more time, wherein subsequent scanning takes place after the error correction code has been applied to data being read from or written to a cell.

4. The method according to claim 3, wherein subsequent scanning takes place based on the number of read cycles, write cycles, or both for the block of data; the number of operation cycles of the block of data; the number of operation cycles of an array containing the block of data; or some combination thereof.

5. The method according to claim 3 further comprising checking the value in the error flag bit and correcting the value in the error flag bit if the most recent error rate is different than indicated by the value in the error flag bit.

6. The method according to claim 1, wherein the block of data is a memory block.

7. The method according to claim 6, wherein the memory block is selected from the group consisting of MRAM, RRAM, PCM, STTRAM, PMC, and flash memory.

8. The method according to claim 1, wherein scanning the block of data for errors utilizes a built in self test (BIST) mechanism.

9. A method of checking and correcting data in at least one block of data, wherein the at least one block of data comprises at least one cell for storing data and at least one error flag bit, the method comprising:
- detecting errors in the at least one block of data;
- determining a first error rate of the block of data;
- comparing the first error rate of the block of data to an error threshold rate;
- reading from or writing to the at least one block of data, wherein reading or writing comprise utilizing an error correction code, wherein a weak error correction code is utilized when the first error rate of the block of data is below the error threshold rate, and a strong error correction code is applied when the first error rate of the block of data is at or above the error threshold rate, wherein the weak error correction code is a different type of error correction code than the strong error correction code;
- detecting errors in the at least one block of data after the data has been read from or written to the at least one cell within the at least one block of data;
- determining a second error rate of the block of data based on the detection of errors after the data has been read from or written to the at least one cell;
- comparing the second error rate of the block of data to the error threshold rate; and
- reading from or writing to the at least one block of data, wherein reading or writing comprises utilizing an error correction code, wherein a weak error correction code is utilized when the second error rate of the block of data is below the error threshold rate, and a strong error correction code is applied when the second error rate of the block of data is at or above the error threshold rate.

10. The method according to claim 9 further comprising storing a value in the error flag bit, wherein a first value is stored if the first error rate is below the error threshold and a second value is stored if the first error rate is at or above the error threshold.

11. The method according to claim 10 further comprising comparing the value written to the error flag bit to the value that would be written to the error flag bit based on the second error rate, wherein the first value would be written if the second error rate is below the error threshold and the second value would be written if the second error rate is at or above the error threshold.

12. The method according to claim 11 further comprising writing the value to the error flag bit based on the second error rate if it is different from the value currently in the error flag bit.

13. The method according to claim 9, wherein the block of data is a memory block.

14. The method according to claim 13, wherein the second detection occurs after a scan delay time, wherein the scan delay time is a predetermined time between scans based on the type of memory.

15. The method according to claim 13, wherein the memory is selected from the group consisting of MRAM, RRAM, PCM, STTRAM, PMC, and flash memory.

16. The method according to claim 9 further comprising reading from or writing to the block of data more than once before errors are detected in the block of data the second time.

17. The method according to claim 16, wherein the time at which errors are detected the second time is based on the number of read cycles, write cycles, or both for the block of data; the number of operation cycles of the block of data; the number of operation cycles of an array containing the block of data; or some combination thereof.

18. The method according to claim 9, wherein scanning the block of data for errors utilizes a built in self test (BIST) mechanism.

19. A data device comprising:
- at least one block of data comprising a plurality of cells for storing data and at least one error flag bit;
- a scanning component, wherein the scanning component is configured to scan the at least one block of data for errors and determine an error rate for the at least one block of data;
- a strong error correction code;
- a weak error correction code, wherein the weak error correction code is a different type of error correction code than the strong error correction code; and
- an error correction code router, wherein the error correction code router routes the at least one block of data to be encoded by either the strong error correction code or the weak error correction code based on the error rate determined by the scanning component.

20. The data device according to claim 19, wherein the scanning component further includes a writing component that is configured to write a value to the error flag bit that is indicative of whether the strong error correction code or the weak error correction code is to be utilized.

21. The data device according to claim 19, wherein the weak error correction code is utilized when the error rate is below an error threshold, and the strong error correction code is utilized when the error rate is at or above the error threshold.

22. The data device according to claim 19, wherein the at least one block of data comprises at least one of MRAM, RRAM, PCM, STTRAM, PMC, and flash memory.

23. The data device according to claim 19, wherein the error correction code router is a multiplexer or some other type of permanent routing.

* * * * *